(12) United States Patent
Ye et al.

(10) Patent No.: US 9,470,839 B2
(45) Date of Patent: Oct. 18, 2016

(54) LIGHT SOURCE MODULE AND BACKLIGHT UNIT INCLUDING THE SAME

(71) Applicant: Samsung Display Co., Ltd., Yongin, Gyeonggi-Do (KR)

(72) Inventors: Byoung Dae Ye, Yongin-si (KR); Young Chun Kim, Seoul (KR); Hyuk Hwan Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/509,782

(22) Filed: Oct. 8, 2014

(65) Prior Publication Data

US 2015/0369997 A1 Dec. 24, 2015

(30) Foreign Application Priority Data

Jun. 19, 2014 (KR) ........................ 10-2014-0075042

(51) Int. Cl.
| | |
|---|---|
| *H01L 33/00* | (2010.01) |
| *F21V 8/00* | (2006.01) |
| *H01L 33/50* | (2010.01) |
| *H01L 33/60* | (2010.01) |
| *H01L 33/46* | (2010.01) |

(52) U.S. Cl.
CPC ........... *G02B 6/0073* (2013.01); *G02B 6/0031* (2013.01); *H01L 33/50* (2013.01); *H01L 33/60* (2013.01); *G02B 6/009* (2013.01); *G02B 6/0078* (2013.01); *G02B 6/0083* (2013.01); *H01L 33/46* (2013.01)

(58) Field of Classification Search
None
See application file for complete search history.

(56) References Cited

U.S. PATENT DOCUMENTS

| | | | |
|---|---|---|---|
| 7,293,908 B2 | 11/2007 | Beeson et al. | |
| 7,800,711 B2 * | 9/2010 | Kim | ...................... G02B 6/0031 349/65 |
| 2008/0186733 A1* | 8/2008 | Ho | ........................ G02B 6/0021 362/610 |
| 2010/0030835 A1 | 2/2010 | Andreev et al. | |
| 2010/0270570 A1* | 10/2010 | Cheng | ..................... H01L 33/50 257/98 |
| 2012/0012872 A1* | 1/2012 | Shen | ...................... H01L 33/486 257/98 |
| 2015/0340565 A1* | 11/2015 | Tsutsumi | ................ H01L 33/38 257/98 |

FOREIGN PATENT DOCUMENTS

| | | |
|---|---|---|
| JP | 2013084690 A | 5/2013 |
| KR | 1020040029255 A | 4/2004 |
| KR | 1020070039503 A | 4/2007 |
| KR | 1020070069490 A | 7/2007 |
| KR | 1020070103882 A | 10/2007 |
| KR | 100890950 B1 | 3/2009 |
| KR | 1020110054304 A | 5/2011 |
| KR | 1020110111087 A | 10/2011 |
| KR | 1020130026893 A | 3/2013 |
| KR | 1020140064393 A | 5/2014 |
| WO | WO 2009/093583 A1 | 7/2009 |

* cited by examiner

*Primary Examiner* — Sonya D McCall Shepard
(74) *Attorney, Agent, or Firm* — Innovation Counsel LLP

(57) ABSTRACT

Provided are a light source module and a backlight unit. According to an embodiment, the light source module comprises a circuit board, at least one LED chip electrically connected onto the circuit board, a reflective surface on an upper surface of the LED chip configured to reflect light, and a fluorescent surface on at least one side surface of the LED chip configured to emit the light.

20 Claims, 16 Drawing Sheets

LIGHT SOURCE MODULE AND BACKLIGHT UNIT INCLUDING THE SAME

CROSS-REFERENCE TO RELATED APPLICATIONS

This application is based on and claims priority from Korean Patent Application No. 10-2014-0075042, filed on Jun. 19, 2014, in the Korean Intellectual Property Office, the disclosure of which is incorporated herein in its entirety by reference.

BACKGROUND

1. Field

The present application relates to a light source module and a backlight unit including the same.

2. Description of the Prior Art

A liquid crystal display (LCD) is given much weight on information display technology. The liquid crystal display displays information in a manner that voltages are applied to liquid crystals that are inserted between both-side glass substrates through electrodes positioned on upper and lower portions of the glass substrates and thus the arrangement directions of the liquid crystals are changed to emit light.

Since the liquid crystal display is a light receiving device which is not self-luminous and thus displays an image through adjustment of permeability of light that comes from an outside, a separate device for irradiating a display panel with light, i.e., a backlight unit, is required.

Recently, a light emitting diode (LED), which is a semiconductor light emitting device that emits light when current flows through the LED, has been spotlighted as a light source of the backlight unit of the liquid crystal display. Since the LED has the advantages of long lifespan, low power consumption, rapid response speed, and superior initial driving characteristics, it has been widely used as a backlight unit of an illumination device, a display board, or a display device, and its application fields have been gradually extended. Further, researches to heighten the efficiency of the backlight using the LED are under progress.

SUMMARY

Accordingly, one embodiment provides a light source module that is slim and has uniform luminance distribution and a backlight unit including the same.

Another embodiment provides a light source module that can prevent light leakage and hot spot and a backlight unit including the same.

Additional features of the inventive concept will be set forth in part in the description which follows and in part will become apparent to those having ordinary skill in the art upon examination of the following or may be learned from practice of the inventive concept.

In one embodiment, there is provided a light source module comprising a circuit board, at least one LED chip electrically connected onto the circuit board, a reflective surface on an upper surface of the LED chip configured to reflect light, and a fluorescent surface on at least one side surface of the LED chip configured to emit the light.

In another embodiment, there is provided a backlight unit comprising a light guide panel, at least one light emitting element arranged on a side surface of the light guide panel configured to generate light, and a circuit board electrically connected to the light emitting element. The light emitting element includes an LED chip, a reflective surface on an upper surface of the LED chip configured to reflect the light, and a fluorescent surface on at least one side surface of the LED chip configured to emit the light.

In still another embodiment, there is provided a backlight unit comprising a first light guide panel, a second light guide panel, at least one light emitting element arranged between the first light guide panel and the second light guide panel configured to generate light, and a circuit board electrically connected to the light emitting element. The light emitting element includes an LED chip, a reflective surface on an upper surface of the LED chip configured to reflect the light, and a fluorescent surface on at least one side surface of the LED chip configured to emit the light.

According to the various embodiments, at least the following features can be achieved.

According to one embodiment, it becomes possible to provide the light source module that is slim and has uniform luminance distribution and the backlight unit including the same.

Further, it becomes possible to provide the light source module that can prevent light leakage and hot spots and the backlight unit including the same.

The features according to the various embodiments are not limited to the contents as exemplified above, but at least include further various features as included in the description.

BRIEF DESCRIPTION OF THE DRAWINGS

The above and other features of the inventive concept will be more apparent from the following detailed description taken in conjunction with the accompanying drawings, in which.

DETAILED DESCRIPTION OF THE EMBODIMENTS

Figure 1:
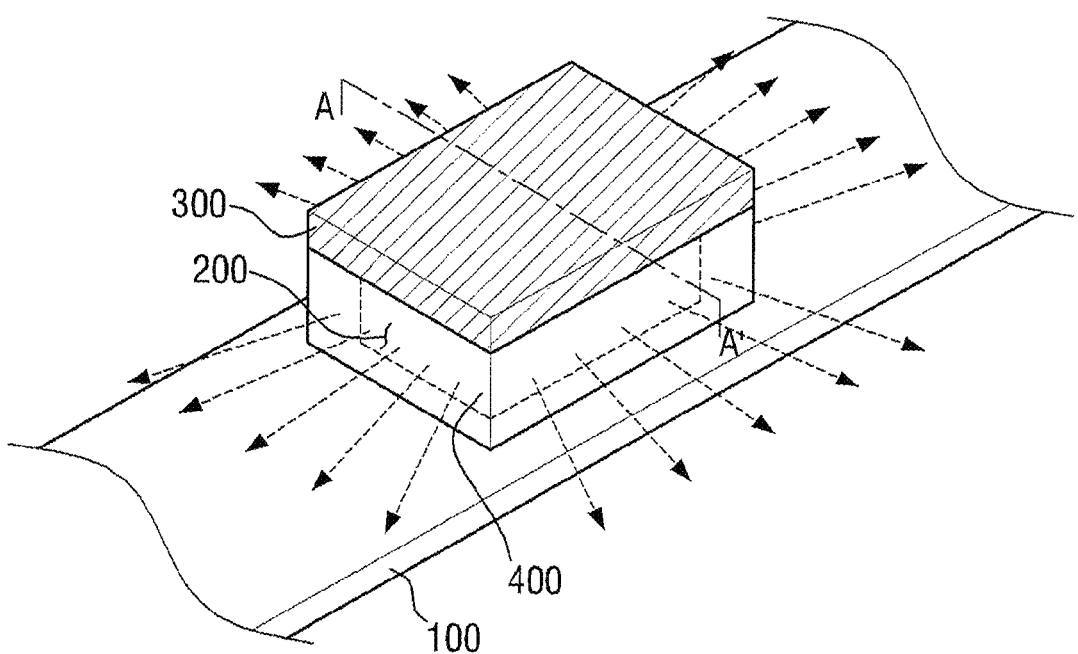
FIG. 1 is a perspective view of a light source module according to an embodiment.

The aspects and features of the inventive concept and methods for achieving the aspects and features will be apparent by referring to the embodiments to be described in detail with reference to the accompanying drawings. However, the inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the inventive concept is only defined within the scope of the appended claims. In the entire description, the same reference numerals are used for the same elements across various figures. In the drawings, sizes and relative sizes of layers and areas may be exaggerated for clarity in explanation.

The term "on" that is used to designate that an element is on another element located on a different layer or a layer includes both a case where an element is located directly on another element or a layer and a case where an element is located on another element via another layer or still another element.

Although the terms "first, second, and so forth" are used to describe diverse constituent elements, such constituent elements are not limited by the terms. The terms are used only to discriminate a constituent element from another constituent element. Accordingly, in the following description, a first constituent element may be a second constituent element.

Hereinafter, embodiments will be described with reference to the accompanying drawings.

Figure 2:
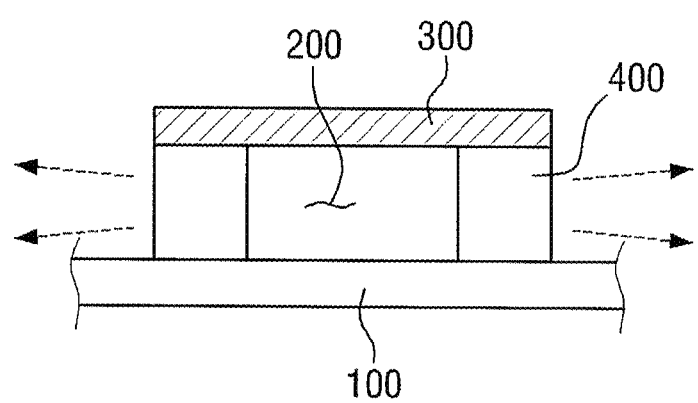
FIG. 2 is a cross-sectional view of the light source module of FIG. 1 taken along line A-A' of FIG. 1.

FIG. 1 is a perspective view of a light source module according to an embodiment, and FIG. 2 is a cross-sectional view of the light source module of FIG. 1 taken along line A-A' of FIG. 1.

Referring to FIGS. 1 and 2, a light source module according to an embodiment may include a circuit board 100, at least one LED chip 200 electrically connected to the circuit board 100, a reflective surface 300 formed on an upper surface of the LED chip 200 to reflect light, and a fluorescent surface 400 emitting light.

The LED chip 200 may be electrically connected onto the circuit board 100. Specifically, one or more LED chips 200 may be provided to be arranged in one direction of the circuit board 100, and the arrangement of the LED chip 200 will be described later.

The LED chip 200 may receive an electrical signal from the circuit board 100 and may emit light through the fluorescent surface 400 formed at least one side surface of the LED chip 200. The circuit board 100 may include a circuit pattern (not illustrated) to apply the electrical signal to the LED chip 200. The circuit pattern may be made of a metal material having superior electrical conductivity and thermal conductivity, and for example, gold (Au), silver (Ag), or copper (Cu).

The circuit board 100 may be a printed circuit board (PCB), or may be formed of an organic resin material including epoxy, triazine, silicon, or polyimide, and other organic resin materials. Further, the circuit board 100 may be a flexible PCB (FPCB) or a metal core PCB (MCPCB).

The reflective surface 300 formed on the upper surface of the LED chip 200 may be formed of a member that reflects light. For example, the reflective surface 300 may be in the form in which a resin, such as a polycarbonate (PC) resin, a mixture of the polycarbonate resin and an acrylonitrile-butadiene-styrene copolymer resin, or a mixture of the polycarbonate resin and glass fiber (G/F), is mixed with a light reflecting material, such as $TiO_2$, Al, or white silicon, but is not limited thereto. In addition, a material that is typically used to reflect light in the art may be mixed with the above-described resin to be used as the reflective surface 300.

Since the above-described light reflecting material has a high heat transfer rate, it may dissipate the heat that is generated from the LED chip 200 to an outside.

The LED chip 200 may be mounted on the circuit board 100 through a chip on board (COB) technology. Although not illustrated in the drawing, the LED chip 200 and the circuit board 100 may be electrically connected to each other by a bump electrode (not illustrated), and thus does not require any separate molding frame or lead frame to achieve a slim light source module that emits light.

Mounting of the LED chip 200 may include preparing the LED chip 200 on which the reflective surface 300 and the fluorescent surface 400 are formed, soldering the mount member on a mount position of the circuit board 100, heating the soldered circuit board 100 on a hot plate at an appropriate temperature, and putting the LED chip 200 on the heated circuit board 100. Next, the LED chip 200 may be mounted on the circuit board 100 by fixing the LED chip 200 onto the circuit board 100 through blowing of hot wind or applying of pressure to the circuit board 100 mounted with the LED chip 200. However, the mounting method or mounting order is not limited to that as described above, but the mounting order may be changed in a manner that the fluorescent surface 400 and the reflective surface 300 are formed after mounting the LED chip 200. The mounting method or the mounting method may be appropriately changed according to other methods that are typically known in the art.

The fluorescent surface 400 may be in the form in which a fluorescent material is included in a resin film to form a fluorescent body. The fluorescent material may include at least one of a red fluorescent material, a green fluorescent material, and a yellow fluorescent material, and may include at least one of YAG, TAG, silicate, nitride, and oxynitride-based materials, but is not limited thereto.

The material that forms the fluorescent body will be described in more detail. The yellow fluorescent material may be a YAG-series fluorescent material, such as $(Y_{1-x-y}Gd_xCe_y)_3Al_5O_{12}$, $(Y_{1-x}Ce_x)_3Al_5O_{12}$, $(Y_{1-x}Ce_x)_3(Al_{1-y}Ga_y)_5O_{12}$, or $(Y_{1-x-y}Gd_xCe_y)_3(Al_{1-z}Ga_z)_5O_{12}$, a silicate-series fluorescent material, such as $(Sr,Ca,Ba,Mg)_2SiO_4:Eu$, or an oxynitride fluorescent material, such as $(Ca,Sr)Si_2N_2O_2:Eu$. The green fluorescent material may be $Y_3(Al,Ga)_5O_{12}:Ce$, $CaSc_2O_4:Ce$, $Ca_3(Sc,Mg)_2Si_3O_{12}:Ce$, $(Sr,Ba)_2SiO_4:Eu$, $(Si,Al)_6(O,N)_8:Eu(\beta\text{-sialon})$, $(Ba,Sr)_3Si_6O_{12}N_2:Eu$, $SrGa_2S_4:Eu$, or $BaMgAl_{10}O_{17}:Eu,Mn$. The red fluorescent material may be $(Ca,Sr,Ba)_2Si_5(N,O)_8:Eu$, $(Ca,Sr,Ba)Si(N,O)_2:Eu$, $(Ca,Sr,Ba)AlSi(N,O)_8:Eu$, $(Sr,Ba)_3SiO_5:Eu$, $(Ca,Sr)S:Eu$, $(La,Y)_2O_2S:Eu$, or $K_2SiF_6:Mn$.

The light may be emitted through the fluorescent surface 400 of the LED chip 200, and the light that is emitted from the LED chip 200 may be spread at a wide emission angle in the left/right direction. In contrast, since the light that travels upward is reflected by the reflective surface 300 formed on the upper side of the LED chip 200, the emission angle in the upper/lower direction may be relatively narrower than the emission angle in the left/right direction.

On the other hand, in the case of applying the light source module to a backlight unit to be described later, the light can be uniformly incident to the inside of a light guide panel through widening of the emission angle in the left/right direction of the light that is emitted from the light source module. That is, by widening the emission angle in the left/right direction of the light that is emitted from the light source module itself without any separate optical lens, the light that is incident to the inside of the light guide panel can be uniformly spread. Accordingly, it becomes possible to resolve a hot spot phenomenon that a strong bright point occurs at a specific region due to the difference in luminance between the LED chips when plural LED chips are used.

Further, the emission angle in the upper/lower direction of the light that is emitted from the light source module itself may be narrowed by the reflective surface 300 to make the light travel into the inside of the light guide panel. As the internal elements of the display device become slim, the thickness of the light guide panel also becomes small. Accordingly, by narrowing the traveling direction of the light that is emitted from the LED in the upper/lower direction, the incident rate of the light to the inside of the slim light guide panel can be improved, and thus light leakage can be prevented from occurring.

According to the present embodiment, since the light path can be controlled in a manner that the emission angle of the light that is emitted in the left/right direction is widened and the emission angle of the light that is emitted in the upper/lower direction is narrowed without using a separate lens structure, the light leakage and the hot spot phenomenon can be effectively prevented even in the slim display structure, and the uniform luminance distribution can be achieved.

The LED chip 200 may include four side surfaces and upper and bottom surfaces. That is, the LED chip 200 may be in a cuboidal shape, but is not limited thereto. The circuit board 100 may be positioned on the lower surface of the LED chip 200, and the LED chip 200 and the circuit board 100 may be electrically connected to each other by a bump electrode (not illustrated).

The bump electrode may be electrically connected to the circuit pattern of the circuit board as a bump electrode, such as a solder bump, and may be bonded in a flip type. Accordingly, a separate wire is unnecessary, and as a separate bonding area of the wire is not necessary, the area of the LED chip 200 that is mounted on the circuit board 100 can be reduced, and the overall size and thickness of the final light source module can become slim. Further, if it is assumed that LED chips 200 having the same size are used, the wire bonding area is not necessary, and thus the mounting space of the LED chips 200 can be extended. Accordingly, LED chips 200 having a larger size can be mounted, and thus the light source module having high efficiency can be provided.

The reflective surface 300 may be formed on the upper surface of the LED chip 200 to come in contact with the upper surface of the LED chip 200. Further, the reflective surface 300 may be arranged in parallel to the circuit board 100 in a state where the LED chip 200 is interposed between the circuit board 100 and the reflective surface 300. On the other hand, the horizontal cross section of the reflective surface 300 may include the horizontal cross section of the LED chip 200. Accordingly, the reflective surface 300 may completely cover the upper surface of the LED chip 200 or may project to be longer than the upper surface of the LED chip 200 by a predetermined distance. Accordingly, the emission angle of the light that travels upwardly of the LED chip 200 can be narrowed by the reflective surface 300.

Figure 3:
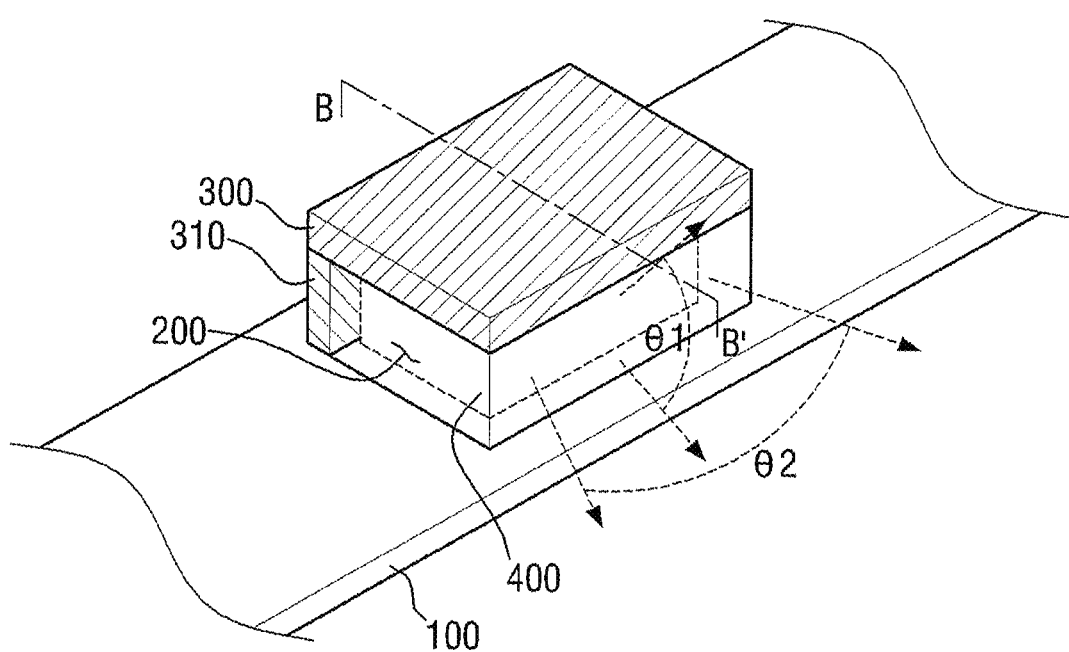
FIG. 3 is a perspective view of a light source module according to another embodiment.
Figure 4:
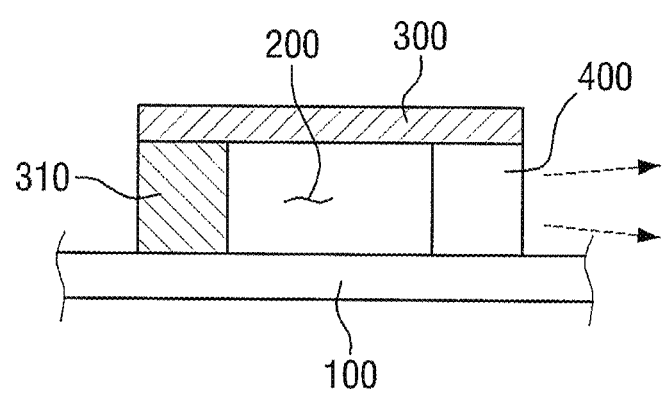
FIG. 4 is a cross-sectional view of the light source module of FIG. 3 taken along line B-B' of FIG. 3.

FIG. 3 is a perspective view of a light source module according to another embodiment, and FIG. 4 is a cross-sectional view of the light source module of FIG. 3 taken along line B-B' of FIG. 3.

Referring to FIGS. 3 and 4, in the light source module, the LED chip 200 may further include a side reflective surface 310 which has four side surfaces and is formed on at least one side surface of the LED chip 200 to reflect light. Further, the fluorescent surface 400 may be formed on three side surfaces of the LED chip 200, and for example, if the side reflective surface 310 is formed on any one of the four side surfaces of the LED chip 200, the fluorescent surface 400 may be formed on the other three side surfaces.

Light may be reflected from the side surface of the LED chip 200 on which the side reflective surface 310 is formed, and the light may be emitted from the side surface on which the fluorescent surface 400 is formed. The side reflective surface 310 enables the light emitted from the LED chip 200 to be emitted to a necessary position, and thus a high-efficiency light source module can be provided even if the same LED chip 200 is used. More specifically, for example, there may exist a portion where a light source is necessary and a portion where the light source is unnecessary in the backlight unit that adopts the light source module. By forming the side reflective surface 310 in the portion where the light source is unnecessary and forming the fluorescent surface 400 only in the portion where the light source is necessary, the high-efficiency light source module can be provided.

In one embodiment, the position where the side reflective surface 310 is formed is the rear surface of the LED chip 200 in FIGS. 3 and 4, however, the forming of the side reflective surface 310 is not limited to the position of the rear surface of the LED chip 200. That is, the side reflective surface 310 may also be formed on the left/right surface or the front surface of the LED chip 200, and an ordinary technician in the art can appropriately modify the position according to circumstances.

Hereinafter, referring to FIG. 3, the emission angle of the light that is emitted from the light source module will be described in more detail.

First, the emission angle means a range in which the light is spread, and may also be expressed as an orientation angle. In the description, it is defined as the emission angle of the light. In FIG. 3, it is assumed that the emission angle in the upper/lower direction of the LED chip 200 is $\theta 1$, and the emission angle in the left/right direction thereof is $\theta 2$.

Referring to FIG. 3, since the side reflective surface 310 is formed on the rear side surface among the four side surfaces of the LED chip 200 and the fluorescent surface 400 is formed on the left side surface, the right side surface, and the front side surface of the LED chip 200, the LED chip 200 has a structure that can emit light through the three other side surfaces except for the rear side surface. Accordingly, the light can be spread in a wide range in the left/right direction, and thus the emission angle $\theta 2$ in the left/right direction is in a very wide range. As an example, the emission angle $\theta 2$ in the left/right direction may be in the range of 140° to 150°.

In contrast, since the reflective surface 300 is formed on the upper surface of the LED chip 200 and the circuit board 100 is formed on the lower surface thereof, the light is emitted only from the fluorescent surface 400 formed on the front side as seen in the upper/lower direction of the LED chip 200. Further, the light that is emitted toward the upper surface over a specific angle may be reflected by the reflective surface 300. Accordingly, the emission angle $\theta 1$ in the upper/lower direction has a range that is narrower than the range of the emission angle θ2 in the left/right direction. The emission angle θ1 in the upper/lower direction may have, for example, a range of 100° to 130°.

Particularly, in the light source module according to the present embodiment, since the emission angle in the upper/lower direction and the emission angle in the left/right direction can be adjusted on the LED chip itself even without a separate molding frame, a slim light source module can be formed, and thus the backlight unit and the display device including the light source module can be provided with a slim size. On the other hand, the effects according to the orientation angles in the upper/lower direction and in the left/right direction will be described in more detail while the backlight unit is described.

Figure 5:
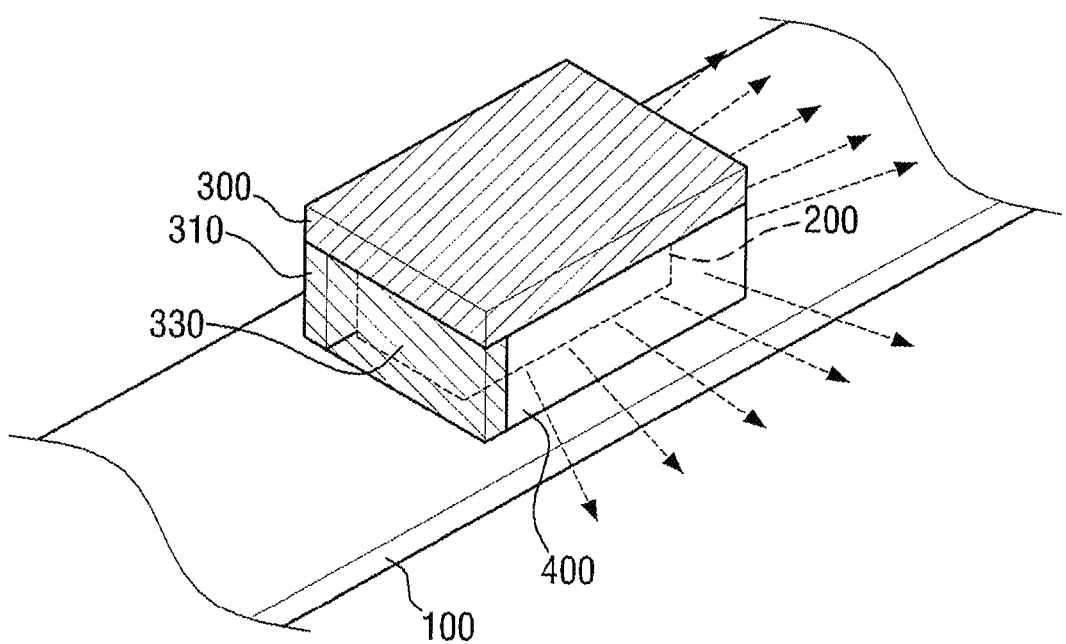
FIG. 5 is a perspective view of a light source module according to still another embodiment.

FIG. 5 is a perspective view of a light source module according to still another embodiment. Referring to FIG. 5, side reflective surfaces 310 and 330 may be formed on two of the four side surfaces of the LED chip 200.

That is, the fluorescent surface 400 may be formed on two of the four side surfaces of the LED chip 200, and the side reflective surfaces 310 and 330 may be formed on the other two side surfaces except for the side surfaces on which the fluorescent surface 400 is formed. FIG. 5 illustrates that the side reflective surface 310 is formed on the rear side surface of the LED chip 200, the side reflective surface 330 is formed on the left side surface, and the fluorescent surface 400 is formed on the right side surface and the front side surface. However, the side reflective surface may be formed on various side surfaces, such as on the left side surface and the right side surface, on the rear side surface and the front side surface, on the rear side surface and the right side surface, or on the right side surface and the front side surface. That is, an ordinary technician in the art can appropriately change the design according to the position where the light source is necessary, and the position where the side reflective surface is arranged is not limited to any specific position.

Further, if needed, the emission angle of the light that is emitted from the LED chip 200 can be appropriately adjusted according the position where the side reflective surface is arranged. For example, as shown in FIG. 5, if the side reflective surfaces 310 and 330 are formed on the rear side surface and the left side surface of the LED chip 200, the light may be emitted through the right side surface and the front side surface. Further, the angle range of the emission angle of the light that is emitted through the right side surface and the front side surface may be adjusted to become narrow in the directions of the left side surface and the rear side surface.

On the other hand, other configurations except for the arrangement of the side reflective surfaces 310 and 330 have already been described, and the duplicate description thereof will be omitted.

Figure 6:
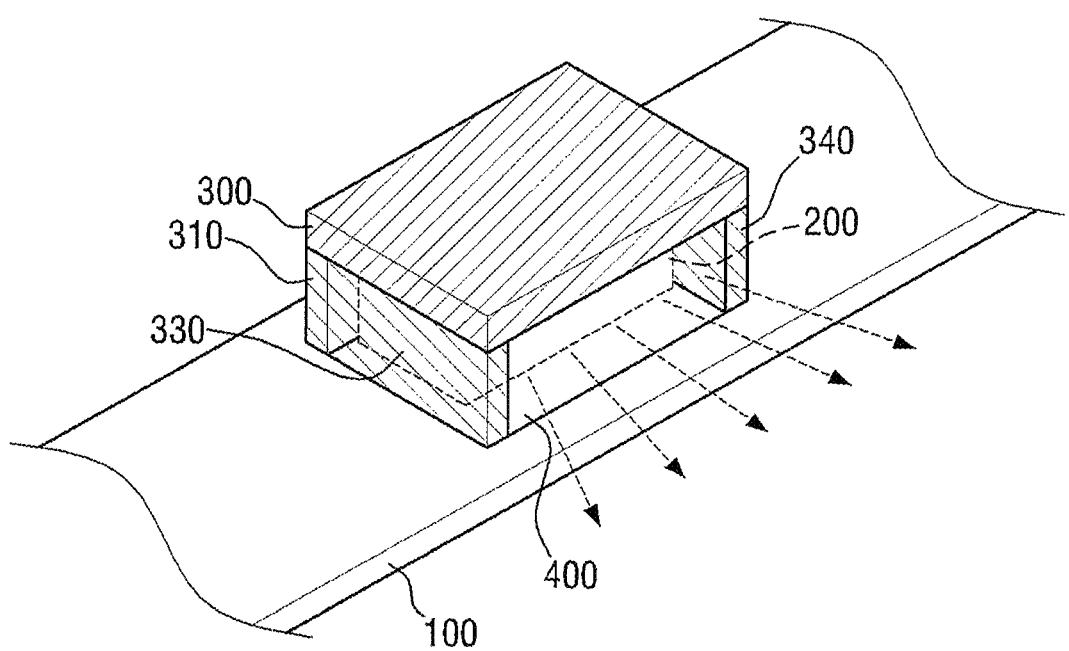
FIG. 6 is a perspective view of a light source module according to still another embodiment.

FIG. 6 is a perspective view of a light source module according to still another embodiment. Referring to FIG. 6, in the light source module, the fluorescent surface 400 may be formed on one side surface of the LED chip 200, and side reflective surfaces 310, 330, and 340 may be formed on three side surfaces of the LED chip 20, which are different from the side surface on which the fluorescent surface 400 is formed. That is, FIG. 6 illustrates that the fluorescent surface 400 may be formed on only one side surface that is the front side surface of the LED chip 200, and the side reflective surfaces 310, 330, and 340 may be formed on the other side surfaces, i.e., the rear side surface, the left side surface, and the right side surface. If the fluorescent surface 400 is formed on only one side surface of the LED chip 200, the position where the fluorescent surface is formed is not limited to the front side surface as shown in FIG. 6, but an ordinary technician in the art can appropriately change the design according to the position where the light source is necessary, such as the rear side surface, the left side surface, or the right side surface.

On the other hand, other configurations except for the arrangement of the side reflective surfaces 310, 330, and 340 have already been described, and the duplicate description thereof will be omitted.

Figure 7:
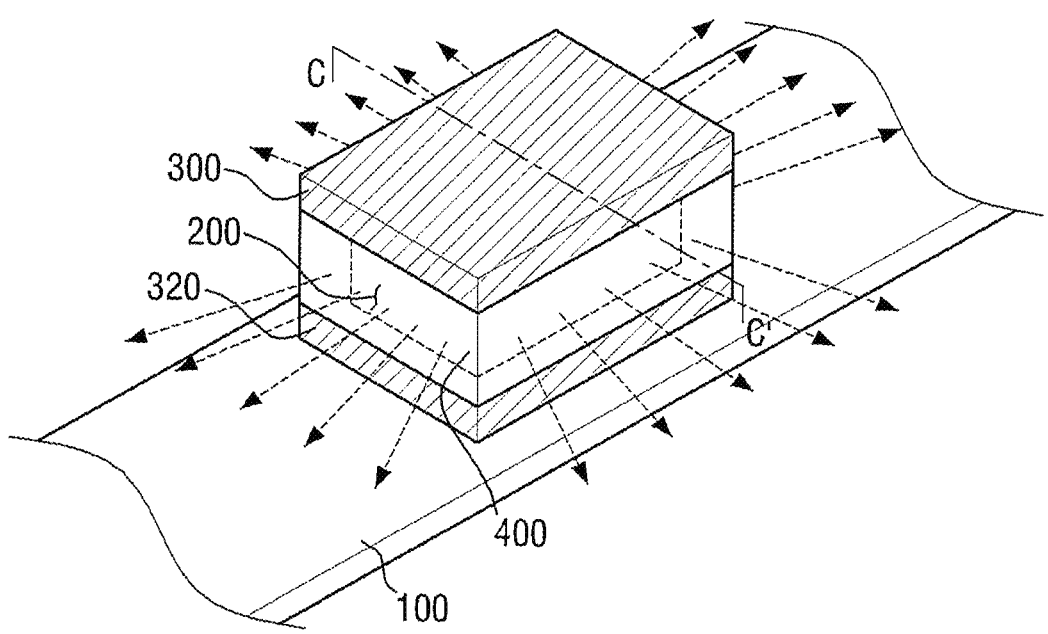
FIG. 7 is a perspective view of a light source module according to still another embodiment.
Figure 8:
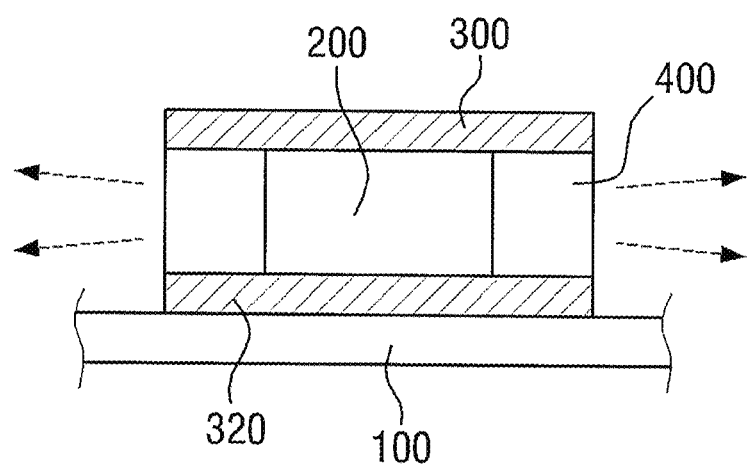
FIG. 8 is a cross-sectional view of the light source module of FIG. 7 taken along line C-C' of FIG. 8.

FIG. 7 is a perspective view of a light source module according to still another embodiment, and FIG. 8 is a cross-sectional view of the light source module of FIG. 7 taken along line C-C' of FIG. 8. Referring to FIGS. 7 and 8, the light source module may further include a bottom reflective surface 320, and the bottom reflective surface 320 may be interposed between the LED chip 200 and the circuit board 100 to reflect light.

Since the bottom reflective surface 320 is further included between the LED chip 200 and the circuit board 100, it can change a path of the light through reflection of the light that is emitted in the lower direction of the LED chip 200, and more effectively reduce the upper/lower emission angles of the light that is emitted from the LED chip 200 together with the reflective surface 300 that is positioned on the upper surface of the LED chip 200. Further, the bottom reflective surface 320 can make the path of the light that travels in the lower direction be directed to the inside of a light guide panel to be described later to improve the efficiency of the LED chip 200.

The bottom reflective surface 320 may be formed to include the area of the bottom surface of the LED chip 200. That is, the horizontal cross section of the bottom reflective surface 320 may be formed to include the horizontal cross section of the bottom surface of the LED chip 200. More specifically, the bottom reflective surface 320 may be formed to cover the whole area of the bottom surface of the LED chip 200 with a substantially equal area, and may project to be longer than the bottom surface of the LED chip 200. Through this, the path of the light that is emitted from the LED chip 200 can be adjusted more effectively, and the efficiency of the LED chip 200 can be heightened.

Although not illustrated, if the light source module includes the bottom reflective surface 320 on the bottom surface of the LED chip 200, a predetermined space that penetrates the bottom reflective surface 320 may be formed so that a bump electrode (not illustrated) that serves to perform electrical connection between the LED chip 200 and the circuit board 100 can be formed, and through this space, the bump electrode (not illustrated) may electrically connect the circuit board 100 and the LED chip 200 to each other through penetration of the bottom reflective surface 320.

On the other hand, the side reflective surfaces 310, 330, and 340 and the bottom reflective surface 320 as described above may be formed of the same material as the material of the reflective surface 300 that is positioned on the upper surface of the LED chip 200. Since the material of the reflective surface 300 has been described, the duplicate description thereof will be omitted.

Figure 9:
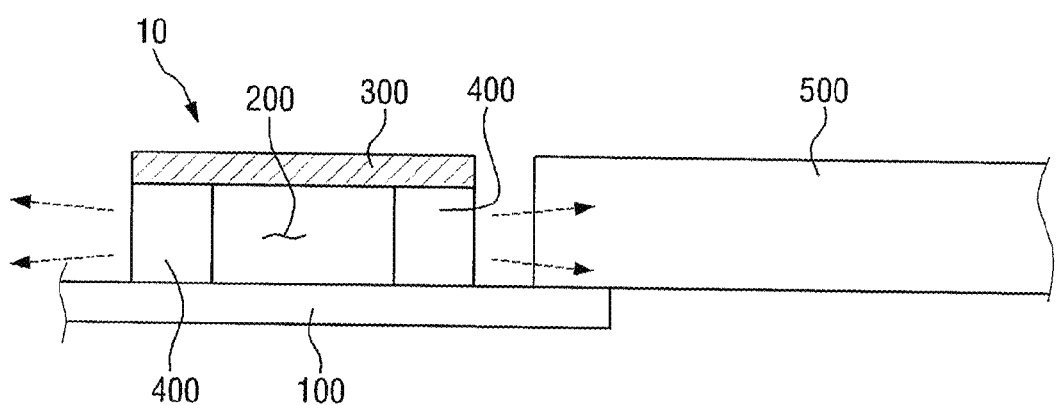
FIG. 9 is a cross-sectional view of a backlight unit according to an embodiment.

FIG. 9 is a cross-sectional view of a backlight unit according to an embodiment. Hereinafter, a backlight unit will be described with reference to FIG. 9.

The backlight unit may include a light guide panel 500, at least one light emitting element 10 arranged on a side surface of the light guide panel 500 to generate light, and a circuit board 100 electrically connected to the light emitting element 10. Further, the light emitting element 10 may include an LED chip 200, a reflective surface 300 formed on an upper surface of the LED chip 200 to reflect the light, and a fluorescent surface 400 formed on at least one side surface of the LED chip 200 to emit the light.

The light guide panel 500 can guide the incident light by changing the light that is incident from the light emitting element 10 arranged on the side surface of the light guide panel 500 to a planar light through reflecting, refracting, and scattering of the incident light and emitting the changed light upward. A display panel (not illustrated) to be described later may be positioned on the upper surface of the light guide panel 500. The light that is incident to the light guide panel 500 may be incident to the display panel (not illustrated) through the light guide panel 500, thereby providing uniform surface light source onto the display panel.

The light guide panel 500 may be made of a polymethylmethacrylate resin, a polycarbonate resin, an acrylonitrile-styrene-butadiene copolymer resin, a polyolefin resin, or a polymethacryl-styrene resin in which polymethylmethacrylate and polystyrene are mixed with each other, but is not limited thereto.

The light guide panel 500 may be in a wedge shape in which the thickness of the light guide panel 500 becomes smaller as the distance between the light guide panel 500 and the light source becomes longer, or may be in a plate shape in which the upper and lower surfaces of the light guide panel 500 are all parallel to each other. According to circumstances, an ordinary technician in the art can appropriately change the shape of the light guide panel 500.

The light guide panel 500 is arranged to be spaced apart from the light emitting element 10 for a predetermined distance to prevent the light emitting element 10 from being damaged due to expansion of the light guide panel 500. That is, the light guide panel 500 may expand due to heat that is generated during using of the backlight unit or an external heat, and when the light guide panel 500 expands, it may apply an impact to the light emitting element 10 mounted on the circuit board 100 to damage the light emitting element 10. Accordingly, by making the light emitting element 10 and the light guide panel 500 be spaced apart from each other for a predetermined distance, the light emitting element 10 can be prevented from being damaged due to the expansion of the light guide panel 500.

The light guide panel 500 may be arranged in the direction that is parallel to the circuit board 100, and the fluorescent surface 400 may be formed on the surface that faces the light guide panel of the LED chip 200. The light that is emitted from the LED chip 200 may be incident to the light guide panel 500 through the fluorescent surface 400 and may be changed to a surface light source having uniform luminance distribution toward the upper surface of the light guide panel.

On the other hand, the light emitting element 10 may include the LED chip 200, the reflective surface 300, and the fluorescent surface 400. Since the details thereof are the same as the contents of the above-described light source module, the duplicate description thereof will be omitted.

Since the emission angle of the light emitting element 10 in the upper/lower direction is narrowed by the reflective surface 300 of the upper surface of the LED chip 200, the light that is emitted from the LED chip 200 can be concentrated onto the inside of the light guide panel 500. If the light that is emitted from the light emitting element 10 does not travel into the light guide panel 500, but travels to the upper side of the light guide panel 500, light leakage may be observed. According to the present embodiment, the emission angle of the light that is emitted from the light emitting element 10 in the upper/lower direction is narrowed, and thus the light leakage problem can be effectively solved. Further, according to the light emitting element 10 according to the present embodiment, the emission angle of the light can be adjusted even without using a separate mold frame or a lens structure, and thus a slim backlight structure and a slim display device can be provided.

Further, since the emission angle of the light that is emitted from the light source element 10 in the left/right direction is relatively widened, the light in the horizontal direction can be widely spread and can be incident to the inside of the light guide panel 500. Accordingly, even in the case of using a slim light guide panel 500, the light that is emitted from the light emitting element 10 itself can be widely spread in the left/right direction, i.e., in the horizontal direction, and thus the backlight unit can provide entirely uniform surface light source to the display panel. Accordingly, the hot spot phenomenon that the light having strong luminance is concentrated onto a specific position can be effectively resolved.

Although not illustrated, the backlight unit may be arranged on a lower chassis that includes a bottom surface and a plurality of side wall portions that surround the bottom surface, and the light guide panel 500 may be arranged on the bottom surface of the lower chassis. As shown in FIG. 9, since the light guide panel 500 is formed on the circuit board 100 at a height that is equivalent to the height of the LED chip 200, the bottom surface of the lower chassis can be formed at a predetermined height that is higher than the height of other positions in the position where the light guide panel 500 is arranged.

Figure 10:
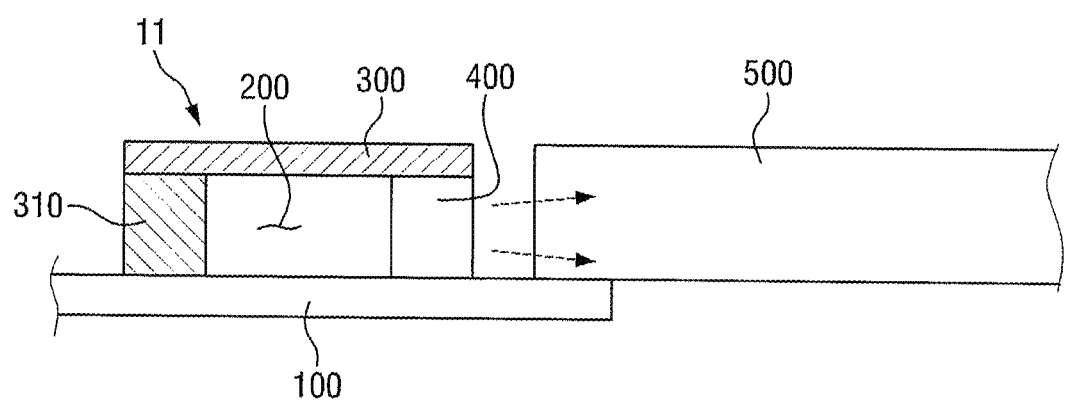
FIG. 10 is a cross-sectional view of a backlight unit according to another embodiment.

FIG. 10 is a cross-sectional view of a backlight unit according to another embodiment. As shown in FIG. 10, in the backlight unit, the LED chip 200 may include four side surfaces and may further include a side reflective surface 310 that is formed on at least one side surface of the LED chip 200 to reflect the light. As shown in FIG. 10, if the light guide panel 500 is arranged on only any one side surface of a light emitting element 11 in the backlight unit, the side reflective surface 310 is applied to prevent the light from being emitted to an unnecessary portion and to concentrate the light onto a necessary portion, and thus the efficiencies of the light emitting element 11 and the LED chip 200 in the light emitting element 11 can be increased.

As shown in FIG. 10, the side reflective surface 310 may be formed on the side surface that is opposite to the side surface of the LED chip 200 that faces the light guide panel 500. That is, if the LED chip 200 includes four side surfaces, the fluorescent surface 400 may be formed on the side surface of the LED chip 200 that faces the light guide panel 500 and the side reflective surface 310 may be formed on the opposite side surface to make the light that is emitted from the light emitting element 11 be efficiently incident to the light guide panel 500.

That is, the fluorescent surface 400 may be formed on the three other side surfaces that are different from the side surface on which the side reflective surface 310 is formed among the side surfaces of the LED chip 200. In other words, the fluorescent surface 400 that can emit light may be formed on the other side surfaces except for the portion where the side reflective surface 310 is formed.

Further, the side reflective surface 310 may be formed to include the side surface area of the LED chip 200 on which the side reflective surface 310 is formed. That is, if the circuit board 100 is formed to include short sides and long sides, the cross section of the side reflective surface 310 may cover and include the cross section of the LED chip 200. Accordingly, the light that travels in the direction of the rear surface of the LED chip 200 can be effectively reflected and travels in the direction of the light guide panel 500 on the front surface.

Figure 11:
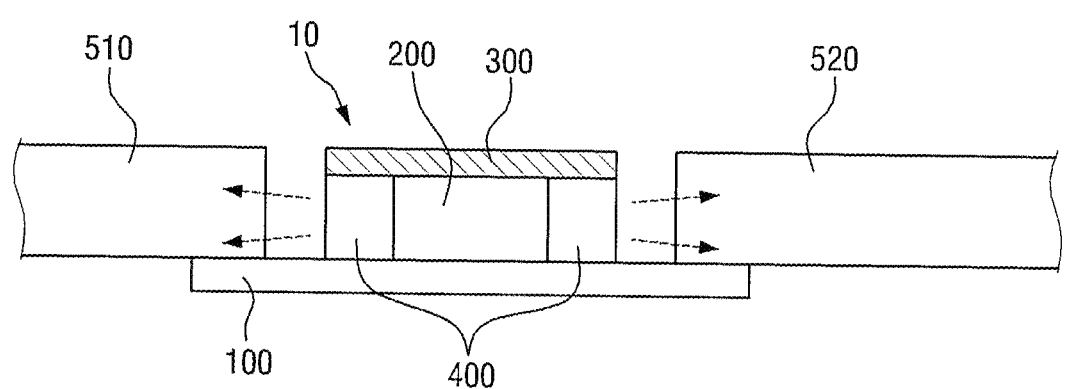
FIG. 11 is a cross-sectional view of a backlight unit according to still another embodiment.

FIG. 11 is a cross-sectional view of a backlight unit according to still another embodiment. Referring to FIG. 11, the backlight unit may include a first light guide panel 510, a second light guide panel 520, at least one light emitting element 10 arranged between the first light guide panel 510 and the second light guide panel 520 to generate light, and a circuit board 100 electrically connected to the light emitting element 10. The light emitting element 10 may include an LED chip 200, a reflective surface 300 formed on an upper surface of the LED chip 200 to reflect the light, and a fluorescent surface 400 formed on at least one side surface of the LED chip 200 to emit the light.

Further, the LED chip 200 may include four side surfaces, and the fluorescent surface 400 may be formed on the surface of the LED chip 200 that faces the first light guide panel 510 and on the surface of the LED chip 200 that faces the second light guide panel 520.

Further, the LED chip 200 may further include a bottom reflective surface 320 interposed between the LED chip 200 and the circuit board 100 to reflect the light. Since this configuration has been described, the duplicate description thereof will be omitted.

Referring to FIG. 11, the backlight unit will be described in more detail. The first light guide panel 510 and the second light guide panel 520 may be formed on both side surfaces based on the light emitting element 10, and in this case, the fluorescent surface 400 may be formed on all side surfaces of the LED chip 200 in the light emitting element 10. That is, the fluorescent surface 400 may be formed on the side surfaces of the LED chip 200 that face the first and second light guide panels 510 and 520. However, the forming of the fluorescent surface 400 is not limited thereto, and an ordinary technician in the art can appropriately perform modifications according to circumstances. For example, the fluorescent surface 400 may be formed on the side surfaces of the LED chip 200 that face the first and second light guide panels 510 and 520, and the side reflective surface (not illustrated) may be formed on the other side surfaces according to circumstances.

Referring to FIGS. 9 to 11, since the configuration, such as the LED chip 200, the reflective surface 300, or the side reflective surface 310, has already been described, the duplicate description thereof will be omitted. The arrangement relationship between the light emitting elements 10 and 11 and the light guide panels 500, 510, and 520 can be appropriately changed by an ordinary technician in the art.

Figure 12:
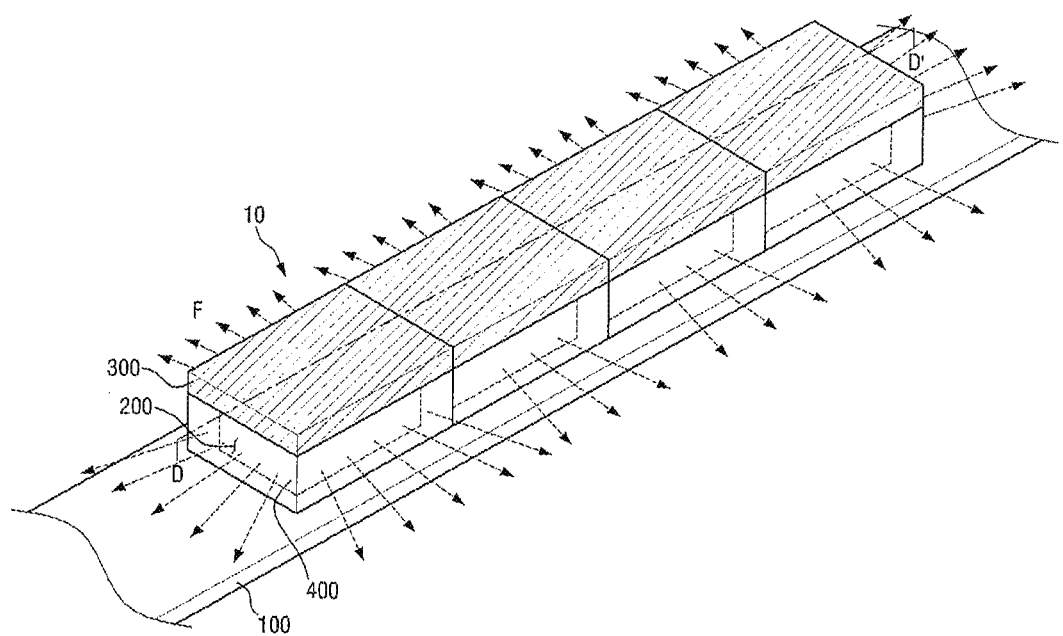
FIG. 12 is a perspective view of a light source module according to still another embodiment.
Figure 13:
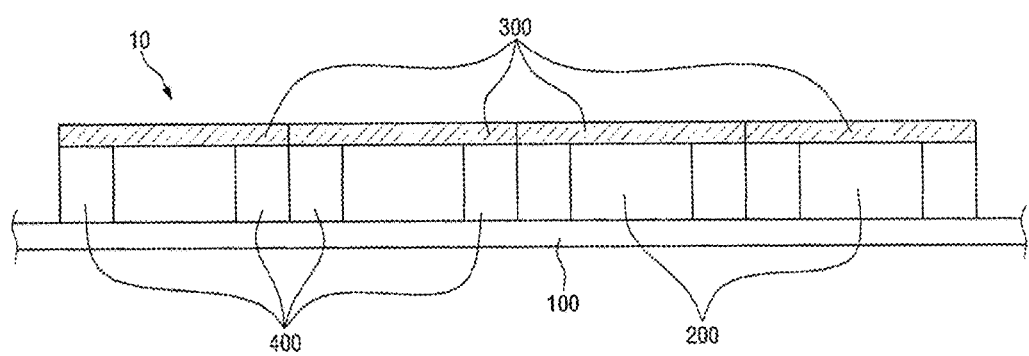
FIG. 13 is a cross-sectional view of the light source module of FIG. 12 taken along line D-D' of FIG. 1.

FIG. 12 is a perspective view of a light source module according to still another embodiment, and FIG. 13 is a cross-sectional view of the light source module of FIG. 12 taken along line D-D' of FIG. 12.

Referring to FIGS. 12 and 13, a plurality of light emitting elements 10 may be arranged on the circuit board 100, and the above-described light emitting elements may be arranged as the light emitting elements 10. Further, the circuit board 100 may include long sides and short sides, and the plurality of light emitting elements 10 may be arranged along the long sides of the circuit board 100. Further, the plurality of light emitting elements 10 may be formed to be adjacent to each other. Since the plurality of light emitting elements 10 are arranged to be adjacent to each other, luminance unbalance that may occur between the light emitting elements 10 can be prevented from occurring.

Figure 14:
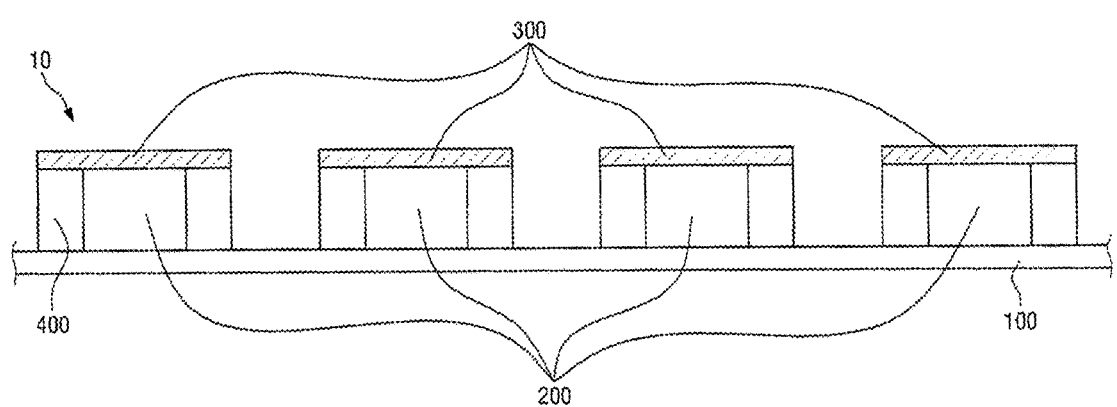
FIG. 14 is a perspective view of a light source module according to still another embodiment.

Referring to FIG. 14, according to a light source module according to still another embodiment, a plurality of light emitting elements 10 may be arranged on the circuit board 100 along the long sides of the circuit board 100. Further, the adjacent light emitting elements 10 may be arranged to be spaced apart from each other for a predetermined distance. That is, the plurality of light emitting elements 10 may be arranged at substantially equal intervals, but are not limited thereto. An ordinary technician in the art can appropriately change the design, such as narrowing or widening the gap between the adjacent light emitting elements 10 according to circumstances.

Figure 15:
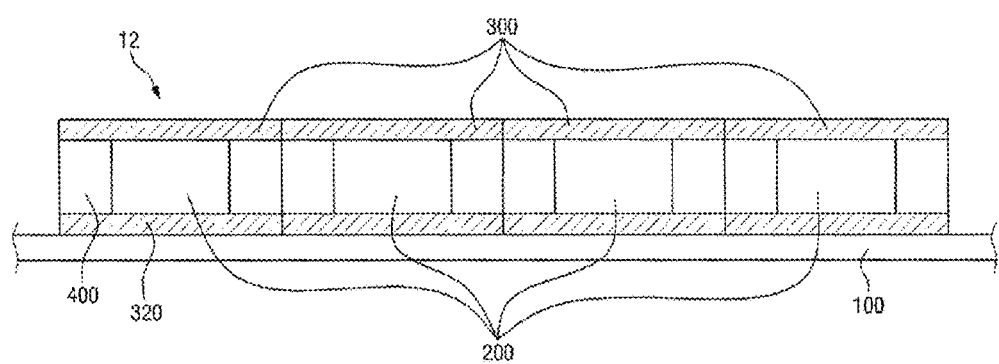
FIG. 15 is a perspective view of a light source module according to still another embodiment.
Figure 16:
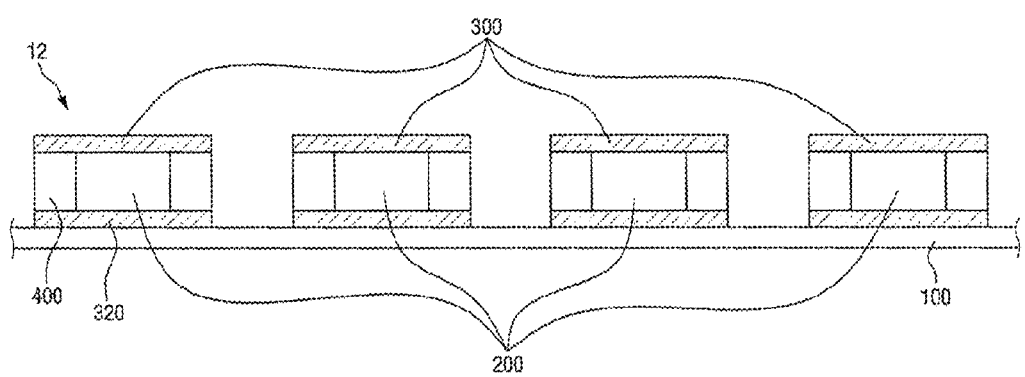
FIG. 16 is a perspective view of a light source module according to still another embodiment.

FIGS. 15 and 16 illustrate light source modules according to still another embodiment. Referring to FIGS. 15 and 16, light emitting elements 12 that adopt a bottom reflective surface 320 on the bottom surface of the LED chip 200 may be arranged on the circuit board 100, and in this case, the plurality of light emitting elements 12 may be formed to be adjacent to each other as shown in FIG. 15, or may be formed to be spaced apart from each other for a predetermined distance as shown in FIG. 16. Since an ordinary technician in the art can appropriately change the above-described arrangements, the duplicate description thereof will be omitted.

The present embodiment can provide a display device that includes the light source module and the backlight unit, and although not illustrated in the drawing, the display device and other configurations will now be described.

The backlight unit may be arranged to be seated on the bottom chassis in the display device, but the arrangement is not limited to any specific position. The bottom chassis may include a bottom surface and a plurality of side walls, and the light source module may be attached to the bottom surface of the bottom chassis. More specifically, the circuit board of the light source module may be attached in parallel to the bottom surface of the bottom chassis, and may be attached in a state where an adhesive member is interposed between the circuit board and the bottom surface. The adhesive member may include, for example, a heat resistant tape, a dual sided tape, resin, urethane, or other adhesives, but is not limited thereto.

Optical sheets including a diffusion film, a prism film, and a protection film may be laminated on the upper portion of the light guide panel to improve the optical performance of the display device. The diffusion film may diffuse the light from the light guide panel to supply the diffused light to the display panel, and the prism lens may collect the light that is diffused by the diffusion film in a direction that is perpendicular to the plane of the upper display panel. On the other hand, in addition to the diffusion film and the prism film, a micro lens array film and a lenticular lens film may be used. For example, several optical sheets may be used in duplicate or the arrangement thereof may be changed. That is, an ordinary technician in the art can appropriately change the arrangement according to circumstances.

Further, a reflective sheet may be arranged on the lower portion of the light guide panel to make the light that travels downward travel to the display panel that is positioned on the upper portion thereof. Accordingly, the light that travels to the lower portion through the light guide panel may be reflected by the reflective sheet to travel to the upper display panel. According to circumstances, a reflective pattern may be formed on the reflective sheet. The reflective pattern may be formed so that the density of the pattern becomes higher as the distance between the reflective pattern and the light emitting element becomes longer, and thus may transfer the light of the uniform luminance to the upper display panel. In addition, other optical sheets to improve the luminance or to prevent moiré phenomenon may be arranged, and an ordinary technician in the art can appropriately change the design according to circumstances.

A middle frame may be laminated on the optical sheet, and a display panel that displays an image may be seated on the upper portion of the middle frame. Further, on the upper portion of the display panel, a top chassis that includes a window may be laminated to cover a part of the display panel. In the display panel, a liquid crystal layer may be interposed between TFT substrates, and may include a color filter substrate, a polarizing filter, and a driving IC. The display panel may function to display an image through adjustment of the strength of the light that is incident from the backlight unit.

On the other hand, since other configurations of the optical sheets or display panels are well known in the art, the detailed description thereof will be omitted.

Although embodiments of the inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A light source module comprising:
   a circuit board;
   at least one light emitting diode (LED) chip electrically connected onto the circuit board and configured to emit light;
   a reflective surface on and directly contacting an upper surface of the LED chip configured to reflect the entire light incident to the reflective surface; and
   a fluorescent surface on at least one side surface of the LED chip.

2. The light source module of claim 1, wherein the reflective surface is arranged in parallel to the circuit board, and
   a horizontal cross section of the reflective surface includes a horizontal cross section of the LED chip.

3. The light source module of claim 1, wherein the LED chip and the circuit board are electrically connected to each other by a bump electrode.

4. The light source module of claim 1, wherein the LED chip includes four side surfaces, and
   the light source module further comprises a side reflective surface on at least one side surface of the LED chip configured to reflect the light.

5. The light source module of claim 4, wherein the fluorescent surface is on three side surfaces of the LED chip.

6. The light source module of claim 4, wherein the fluorescent surface is on two side surfaces of the LED chip, and
   the side reflective surface is on two side surfaces that are different from the side surface on which the fluorescent surface is on.

7. The light source module of claim 4, wherein the fluorescent surface is on one side surface of the LED chip, and
   the side reflective surface is on three side surfaces that are different from the side surface on which the fluorescent surface is on.

8. The light source module of claim 1, further comprising a bottom reflective surface interposed between the LED chip and the circuit board configured to reflect the light.

9. The light source module of claim 8, wherein the bottom reflective surface includes an area of a bottom surface of the LED chip.

10. A backlight unit comprising:
    a light guide panel;
    at least one light emitting element arranged on a side surface of the light guide panel configured to generate light; and
    a circuit board electrically connected to the light emitting element,
    wherein the light emitting element includes a light emitting diode (LED) chip configured to emit the light, a reflective surface on and directly contacting an upper surface of the LED chip configured to reflect the entire light incident to the reflective surface, and a fluorescent surface on at least one side surface of the LED chip.

11. The backlight unit of claim 10, wherein the LED chip and the circuit board are electrically connected to each other by a bump electrode.

12. The backlight unit of claim 10, wherein the reflective surface is arranged in parallel to the circuit board, and
    a horizontal cross section of the reflective surface includes a horizontal cross section of the LED chip.

13. The backlight unit of claim 10, wherein the LED chip includes four side surfaces, and
    the backlight unit further comprises a side reflective surface on at least one side surface of the LED chip configured to reflect the light.

14. The backlight unit of claim 13, wherein the side reflective surface is on an opposite side surface to the side surface of the LED chip that faces the light guide panel.

15. The backlight unit of claim 14, wherein the side reflective surface includes an area of the side surface of the LED chip where the side reflective surface is on.

16. The backlight unit of claim 14, wherein the fluorescent surface is on three side surfaces that are different from the side surface where the side reflective surface is on.

17. A backlight unit comprising:
    a first light guide panel;
    a second light guide panel;
    at least one light emitting element arranged between the first light guide panel and the second light guide panel configured to generate light; and
    a circuit board electrically connected to the light emitting element,
    wherein the light emitting element includes a light emitting diode (LED) chip configured to emit the light, a reflective surface on and directly contacting an upper surface of the LED chip configured to reflect the entire light incident to the reflective surface, and a fluorescent surface on at least one side surface of the LED chip.

18. The backlight unit of claim 17, wherein the LED chip and the circuit board are electrically connected to each other by a bump electrode.

19. The backlight unit of claim 17, wherein the LED chip includes four side surfaces, and
    the fluorescent surface is on the surface of the LED chip that faces the first light guide panel and the surface of the LED chip that faces the second light guide panel.

20. The backlight unit of claim 17, further comprising a bottom reflective surface interposed between the LED chip and the circuit board configured to reflect the light.

* * * * *